United States Patent
Cheng

(10) Patent No.: US 9,274,148 B2
(45) Date of Patent: Mar. 1, 2016

(54) VOLTAGE DETECTION CIRCUIT

(71) Applicant: Anpec Electronics Corporation, Hsin-Chu (TW)

(72) Inventor: Chieh-Wen Cheng, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 38 days.

(21) Appl. No.: 14/492,090

(22) Filed: Sep. 22, 2014

(65) Prior Publication Data

US 2016/0011240 A1  Jan. 14, 2016

(30) Foreign Application Priority Data

Jul. 11, 2014  (TW) .............................. 103123925 A

(51) Int. Cl.
*G01R 27/08* (2006.01)
*G01R 19/00* (2006.01)
*G01R 19/10* (2006.01)

(52) U.S. Cl.
CPC ............ *G01R 19/0084* (2013.01); *G01R 19/10* (2013.01)

(58) Field of Classification Search
CPC ........... G01R 31/3658; G01R 19/2516; G01R 27/18; G01S 19/34
USPC ......... 324/425–440, 444, 255, 500, 522, 713, 324/72.5, 76.39, 76.77, 111, 600, 705, 324/660–669; 320/104–107, 132, 130
See application file for complete search history.

(56) References Cited

U.S. PATENT DOCUMENTS 8,564,325 B2 * 10/2013 Mizoguchi ............... 324/762.08
2009/0295396 A1 * 12/2009 Kouchi et al. ................. 324/426

FOREIGN PATENT DOCUMENTS

TW           201409216           3/2014

* cited by examiner

*Primary Examiner* — Melissa Koval
*Assistant Examiner* — Trung Nguyen
(74) *Attorney, Agent, or Firm* — Winston Hsu; Scott Margo

(57) ABSTRACT

A voltage detection circuit comprises a reference resistor including a terminal for receiving a first voltage; a reference transistor including a control terminal for receiving a second voltage; a comparator, including a first input terminal for receiving a converted voltage and a second input terminal for receiving the second voltage, for generating an output voltage; and a voltage dropping circuit series, comprising a plurality of voltage dropping circuits connected in a series, for converting an input voltage into the converted voltage; wherein the comparator indicates whether the input voltage matches a specific multiple of a voltage difference between the first voltage and the second voltage, and the specific multiple relates to a number of the plurality of voltage dropping circuits.

16 Claims, 4 Drawing Sheets

VOLTAGE DETECTION CIRCUIT

BACKGROUND OF THE INVENTION

1. Field of the Invention

The present invention relates to a voltage detection circuit, more particularly, to a voltage detection circuit which requires lower power and is capable of precisely detecting a specific multiple of a reference voltage or a negative value of a specific multiple of a reference voltage.

2. Description of the Prior Art

Power management integrated circuit (PMIC) has been widely used in electronic products such as notebooks, mainboards, digital cameras, smart phones, tablet computers, etc. Detection circuits such as power on detector, signal ready detector, etc., are included in PMIC. In the prior art, detection circuits for precisely detecting a specific voltage occupy large layout area. Other simple detection circuits with smaller layout area are not such precise. Therefore, the applicant of the present invention has provided a power-on reset circuit in U.S. patent application Ser. No. 13/666,982, which is capable of precisely detecting a twice of a reference voltage, utilizes layout area efficiently, and has characteristics such as low quiescent current, low power consumption, etc.

Nevertheless, in practical applications, besides detecting a twice of a voltage value, a detection circuit may need to detect other multiple of a reference voltage, or a negative value of a multiple of a reference voltage. Therefore, how to design a detection circuit, which is capable of detecting any multiple of the reference voltage and also has characteristics such as good detection precision, efficient utilization of layout area, low quiescent current, low power consumption, etc., is a significant objective in the field.

SUMMARY OF THE INVENTION

It is therefore a primary objective of the present invention to provide a voltage detection circuit which is lower power and capable of precisely detecting a specific multiple of a reference voltage or a negative value of a specific multiple of a reference voltage.

The present invention discloses a voltage detection circuit, for detecting an input voltage generated by an input voltage generator, the voltage detection circuit comprising a reference resistor, comprising a first terminal and a second terminal, wherein the first terminal is utilized for receiving a first voltage; a reference transistor, comprising a first terminal, a second terminal and a control terminal, wherein the first terminal of the reference transistor is coupled to the second terminal of the reference resistor, and the control terminal of the reference transistor is utilized for receiving a second voltage; a comparator, comprising a first input terminal and a second input terminal, wherein the first input terminal is coupled to the second terminal of the reference transistor for receiving a converted voltage, the second input terminal is utilized for receiving the second voltage, and the comparator is utilized for generating an output voltage according to the converted voltage and the second voltage; and a voltage dropping circuit series, comprising a plurality of voltage dropping circuits connected in a sequence, wherein a terminal of the voltage dropping circuit series is coupled to the input voltage generator, another terminal of the voltage dropping circuit series is coupled between the first input terminal of the comparator and the second terminal of the reference transistor, and the plurality of voltage dropping circuits are utilized for generating a plurality of voltage drops to convert the input voltage into the converted voltage; wherein the output voltage of the comparator indicates whether the input voltage matches a specific multiple of a voltage difference between the first voltage and the second voltage, and the specific multiple relates to a number of the plurality of voltage dropping circuits.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
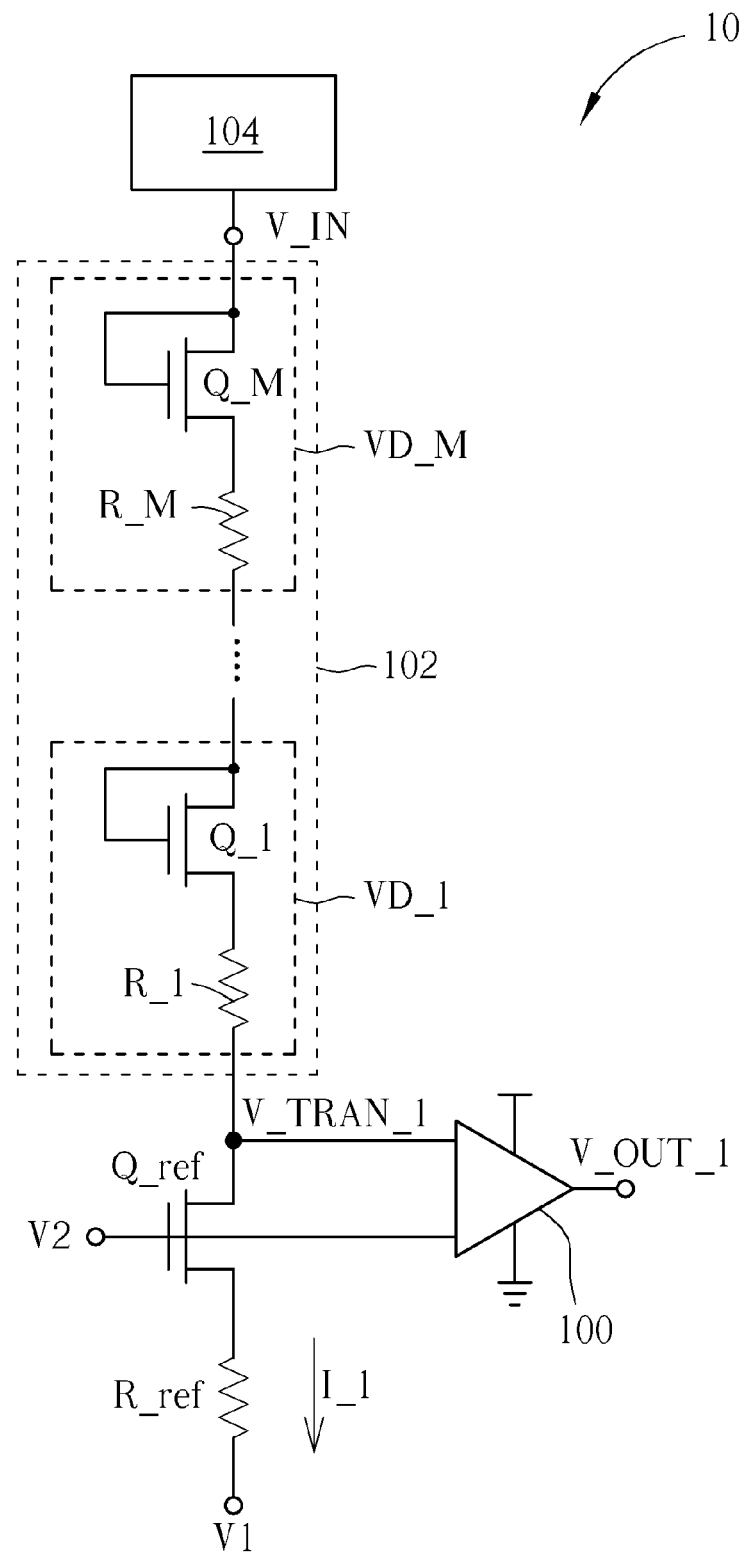
FIG. 1 is a schematic diagram of a voltage detection circuit according to an embodiment of the invention.

Please refer to FIG. 1, which is a schematic diagram of a voltage detection circuit 10 according to an embodiment of the present invention. The voltage detection circuit 10 comprises a reference resistor R_ref, a reference transistor Q_ref, a comparator 100 and a voltage dropping circuit series 102. The reference resistor R_ref comprises a first terminal and a second terminal. The reference transistor Q_ref comprises a first terminal, a second terminal, and a control terminal. The comparator 100 comprises a first input terminal and a second input terminal. Detail structures and connecting methods are shown in FIG. 1. Specifically, the first terminal of the reference resistor R_ref is utilized for receiving a first voltage V1. The second terminal of the reference resistor R_ref is coupled to the first terminal of the reference transistor Q_ref. The control terminal of the reference transistor Q_ref is utilized for receiving a second voltage V2. The first input terminal of the comparator 100 is coupled to the second terminal of the reference transistor Q_ref for receiving a converted voltage V_TRAN_1. The second input terminal of the comparator 100 is coupled to the control terminal of the reference transistor Q_ref for receiving the second voltage V2. The voltage dropping circuit series 102 comprises M sets of voltage dropping circuits VD_1-VD_M connected in a sequence, wherein a terminal of the voltage dropping circuit series 102 is coupled between the first input terminal of the comparator 100 and the second terminal of the reference transistor Q_ref, and another terminal is coupled to an input voltage generator 104 for receiving an input voltage V_IN. Each of the voltage dropping circuits VD_1-VD_M comprises a voltage drop transistor and a voltage drop resistor. The voltage drop transistor comprises a first terminal, a second terminal, and a control terminal. The voltage drop resistor comprises a first terminal and a second terminal. The control terminal of the voltage drop transistor is coupled to the second terminal the voltage drop transistor, and the first terminal of the voltage drop transistor is coupled to the second terminal of the voltage drop resistor. For example, the voltage dropping circuit VD_1 comprises a voltage drop transistor Q_1 and a voltage drop resistor R_1. The control terminal of the voltage drop transistor Q_1 is coupled to the second terminal of the voltage drop transistor Q_1, and the first terminal of the voltage drop transistor Q_1 is coupled to the second terminal of the voltage drop resistor R_1, and so on. The voltage dropping circuits VD_1-VD_M are utilized for generating M voltage drops, so as to convert the input voltage V_IN into the converted voltage V_TRAN_1. The comparator 100 generates an output voltage V_OUT_1 according to the converted voltage V_TRAN_1 and the second voltage V2.

Notably, in this embodiment, the transistors Q_1-Q_M, Q_ref of the voltage detection circuit 10 are metal oxide semiconductor (MOS) transistors; thus, currents flowing through the transistors Q_1-Q_M, Q_ref are substantially the same. In such a situation, the transistors Q_1-Q_M are properly designed to be matched to the transistor Q_ref, such that voltage differences between the control terminals and the first terminals of the transistors Q_1-Q_M, Q_ref are substantially the same. The voltage differences between the control terminals and the first terminals of the transistors Q_1-Q_M, Q_ref are denoted as V_GX. Therefore, a magnitude of a current I_1 flowing through the reference resistor R_ref is obtained by subtracting voltage values of the first voltage V_1 and the voltage difference V_GX between the control terminal and the first terminal of the transistor from a voltage value of the second voltage V2 and then dividing the subtraction result by a resistance of the reference resistor R_ref, i.e., I_1=(V2−V_GX−V_1)/R_ref. Furthermore, the resistors R_1-R_M, R_ref are properly designed to have substantially the same resistance. Take the voltage dropping circuit VD_1 for an example, a voltage drop generated by the voltage drop resistor R_1 is I_1*R_1=V2-V_GX-V1, and a voltage drop generated by the voltage dropping circuit VD_1 is I_1*R_1 plus the voltage difference V_GX between the control terminal and the first terminal of the transistor. Hence, the voltage drop generated by the voltage dropping circuit VD_1 is (V2-V1). Similarly, a voltage drop generated by each voltage dropping circuit VD_x is substantially (V2-V1). Notably, in this embodiment, properly designing the transistors Q_1-Q_M, Q_ref to be matched and the resistors R_1-R_M, R_ref to have substantially the same resistance is an implementation method, but not limited therein, as long as the voltage dropping circuits VD_1-VD_M are properly designed to have each voltage dropping circuit VD_x generating substantially the same voltage drop so as to satisfy the requirements of the present invention.

As can be seen from the above, the M sets of voltage dropping circuits VD_1-VD_M generate M times of the voltage drop (wherein each of the voltage drop is V2-V1), such that the input voltage V_IN is converted into the converted voltage V_TRAN_1, i.e., V_TRAN_1=V_IN−M*(V2-V1). Given that the first input terminal of the comparator 100 receives the converted voltage V_TRAN_1 and the second input terminal of the comparator 100 receives the second voltage V2, when the input voltage V_IN rises such that the converted voltage V_TRAN_1 is greater than the second voltage V2, which means that the input voltage V_IN rises such that V_IN>V2+M*(V2−V1), the comparator 100 changes a state and generates the corresponding output voltage V_OUT_1, to indicate to backend circuits to perform operations. In addition, since the current I_1 relates to the voltage difference (V2−V1) and the reference resistor R_ref, the voltage difference (V2−V1) and the reference resistor R_ref are properly designed such that the current I_1 is low current, to achieve characteristics such as low quiescent current and low power consumption.

Figure 2:
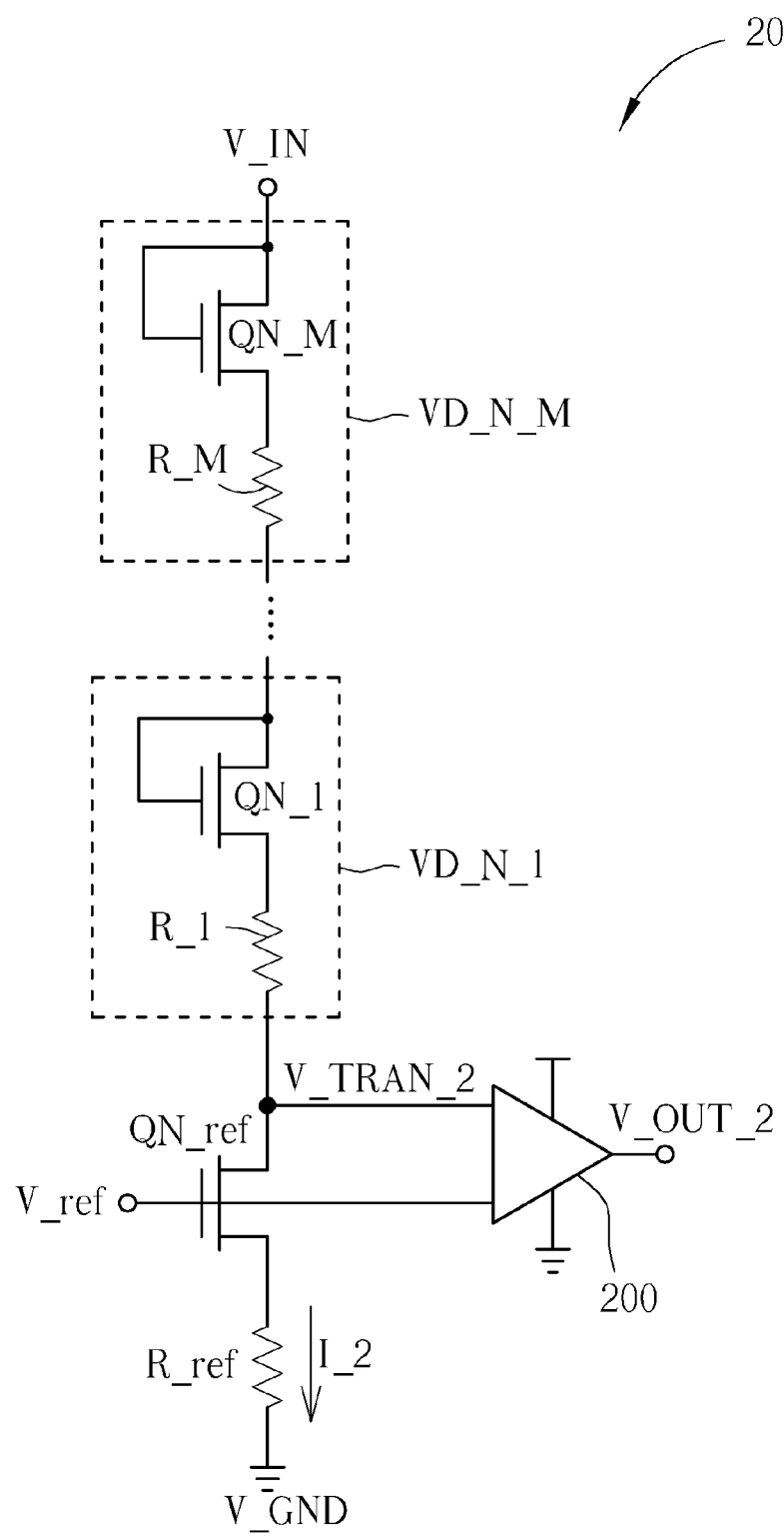
FIG. 2 is a schematic diagram of a multiple voltage detection circuit according to an embodiment of the invention.

Furthermore, the voltage detection circuit 10 may be properly modified as a multiple voltage detection circuit 20, as shown in FIG. 2. A structure of the multiple voltage detection circuit 20 is substantially the same as the structure of the voltage detection circuit 10, wherein the resistors R_1-R_M, R_ref are properly designed to have substantially the same resistance. Different from the voltage detection circuit 10, the first terminal of the reference resistor R_ref of the multiple voltage detection circuit 20 is coupled to a ground terminal, and a control terminal of a reference transistor QN_ref the multiple voltage detection circuit 20 is utilized for receiving a reference voltage V_ref. Moreover, transistors QN_1-QN_M, QN_ref are N-type metal oxide semiconductor (NMOS) transistors. The first terminal of the reference transistor QN_ref is a source of the reference transistor QN_ref, the second terminal of the reference transistor QN_ref is a drain of the reference transistor QN_ref, and the control terminal of the reference transistor QN_ref is a gate of the reference transistor QN_ref. The first terminal of each of the transistors QN_1-QN_M is a source, the second terminal of each of the transistors QN_1-QN_M is a drain, and the control terminal of each of the transistors QN_1-QN_M is a gate. In other words, the multiple voltage detection circuit 20 is derived from the voltage detection circuit 10, wherein the first voltage V1 is a ground voltage V_GND, the second voltage V2 is the reference voltage V_ref, the reference transistor and the voltage drop transistors are NMOS transistors. Since the transistors QN_1-QN_M, QN_ref are NMOS transistors, a current flowing through the transistors QN_1-QN_M, QN_ref are substantially the same. Under a situation that the transistors QN_1-QN_M, QN_ref are properly designed to be matched, gate-to-source voltage differences of the transistors QN_1-QN_M, QN_ref (denoted as V_GS) are substantially the same.

Under such a structure, a magnitude of a current I_2 flowing through the reference resistor R_ref is a value of the reference voltage V_ref minus the gate-to-source voltage difference V_GS and divided by the reference resistor R_ref, i.e., I_2=(V_ref-V_GS)/R_ref. Since the voltage drop resistors R_1-R_M, R_ref have substantially the same resistance, voltage drops generated by the voltage drop resistors R_1-R_M are I_2*R_ref=V_ref−V_GS. Therefore, each voltage dropping circuit VD_N_x of voltage dropping circuits VD_N_1-VD_N_M generates a voltage drop being the gate-to-source voltage difference V_GS plus I_2*R_ref, which means that each voltage dropping circuit VD_N_x generates the same voltage drop as V_ref. Through the M sets of voltage dropping circuits VD_N_1-VD_N_M, the input voltage V_IN is converted into a converted voltage V_TRAN_2, i.e., V_TRAN_2=V_IN−M*V_ref. Given that a first input terminal of a comparator 200 receives the converted voltage V_TRAN_2 and a second input terminal of the comparator 200 receives the reference voltage V_ref, when the input voltage V_IN rises such that the converted voltage V_TRAN_2 is greater than the reference voltage V_ref, which means that the input voltage V_IN rises such that V_IN>V_ref+M*V_ref=(M+1)*V_ref, the comparator 200 changes a state and generates the corresponding output voltage V_OUT_2, to indicate backend circuits to perform operations.

Notably, the multiple voltage detection circuit 20 may be applied to a power-on reset circuit, which detects whether the input voltage V_IN is greater than a specific multiple of the reference voltage V_ref. For the multiple voltage detection circuit 20, the specific multiple is M+1, which is a number of the voltage dropping circuits VD_N_1-VD_N_M plus 1.

Figure 3:
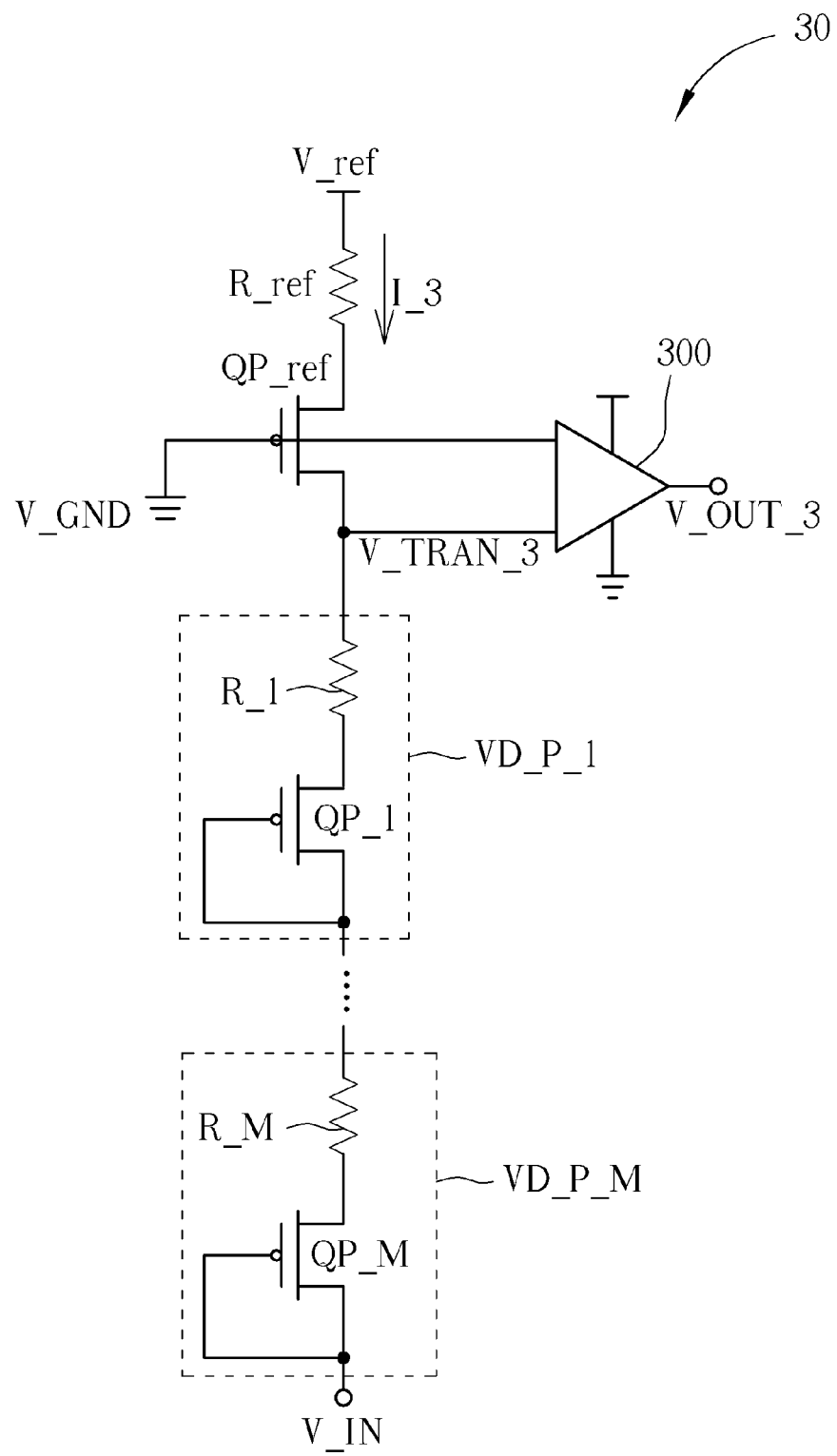
FIG. 3 is a schematic diagram of a negative multiple voltage detection circuit according to an embodiment of the invention.

In another perspective, the voltage detection circuit 10 may be properly modified as a negative multiple voltage detection circuit 30, as shown in FIG. 3. FIG. 3 is a schematic diagram of the negative multiple voltage detection circuit 30 according to an embodiment of the invention. A structure of the negative multiple voltage detection circuit 30 is substantially the same as the structures of the voltage detection circuit 10 and the multiple voltage detection circuit 20, wherein the resistors R_1-R_M, R_ref are properly designed to have substantially the same resistance. Different from the multiple voltage detection circuit 20, the first terminal of the reference resistor R_ref of the negative multiple voltage detection circuit 30 is coupled to a reference voltage V_ref, and a control terminal of a reference transistor QP_ref is coupled to a ground terminal. Moreover, transistors QP_1-QP_M, QP_ref are P-type metal oxide semiconductor (PMOS) transistors. The first terminal of the reference transistor QP_ref is a source of the reference transistor QP_ref, the second terminal of the reference transistor QP_ref is a drain of the reference transistor QP_ref, and the control terminal of the reference transistor QP_ref is a gate of the reference transistor QN_ref. The first terminal of each of the transistors QP_1-QP_M is a source, the second terminal of each of the transistors QP_1-QP_M is a drain, and the control terminal of each of the transistors QP_1-QN_M is a gate. In other words, the negative multiple voltage detection circuit 30 is also derived from the voltage detection circuit 10, wherein the first voltage V1 is the reference voltage V_ref, the second voltage V2 is the ground voltage V_GND, the reference transistor and the voltage drop transistors are PMOS transistors. Since the transistors QP_1-QP_M, QP_ref are PMOS transistors, a current flowing through the transistors QP_1-QP_M, QP_ref are substantially the same. Under a situation that the transistors QP_1-QP_M, QP_ref are properly designed to be matched, source-to-gate voltage differences of the transistors QP_1-QP_M, QP_ref (denoted as V_SG) are substantially the same.

Under such a structure, a magnitude of a current I_3 flowing through the reference resistor R_ref is a value of the reference voltage V_ref minus the source-to-gate voltage difference V_SG and divided by the reference resistor R_ref, i.e., $I\_3=(V\_ref-V\_SG)/R\_ref$. Since the voltage drop resistors R_1-R_M, R_ref have substantially the same resistance, voltage drops generated by the voltage drop resistors R_1-R_M are $I\_3*R\_ref=V\_ref-V\_SG$. Therefore, each voltage dropping circuit VD_P_x of voltage dropping circuits VD_P_1-VD_P_M generates a voltage drop being the source-to-gate voltage difference V_SG plus $I\_3*R\_ref$, which means that each voltage dropping circuit VD_P_x generates the same voltage drop as V_ref. Through the M sets of voltage dropping circuits VD_P_1-VD_P_M, the input voltage V_IN is converted into a converted voltage V_TRAN_3, i.e., $V\_TRAN\_3=V\_IN+M*V\_ref$. Given that a first input terminal of a comparator 300 receives the converted voltage V_TRAN_3 and a second input terminal of the comparator 300 is coupled to the ground terminal (i.e., having a voltage value of 0V), when the input voltage V_IN falls such that the converted voltage V_TRAN_3 is smaller than the ground voltage 0V, which means that the input voltage V_IN falls such that $V\_IN<-M*V\_ref$, the comparator 300 changes a state and generates the corresponding output voltage V_OUT_3, to indicate backend circuits to perform operations.

Notably, the negative multiple voltage detection circuit 30 may be applied to a negative voltage detection (NVD) circuit, which detects whether the input voltage V_IN is smaller than a negative value of a specific multiple of the reference voltage V_ref. For the negative multiple voltage detection circuit 30, the specific multiple is M, which is a number of the voltage dropping circuits VD_P_1-VD_P_M.

Figure 4:
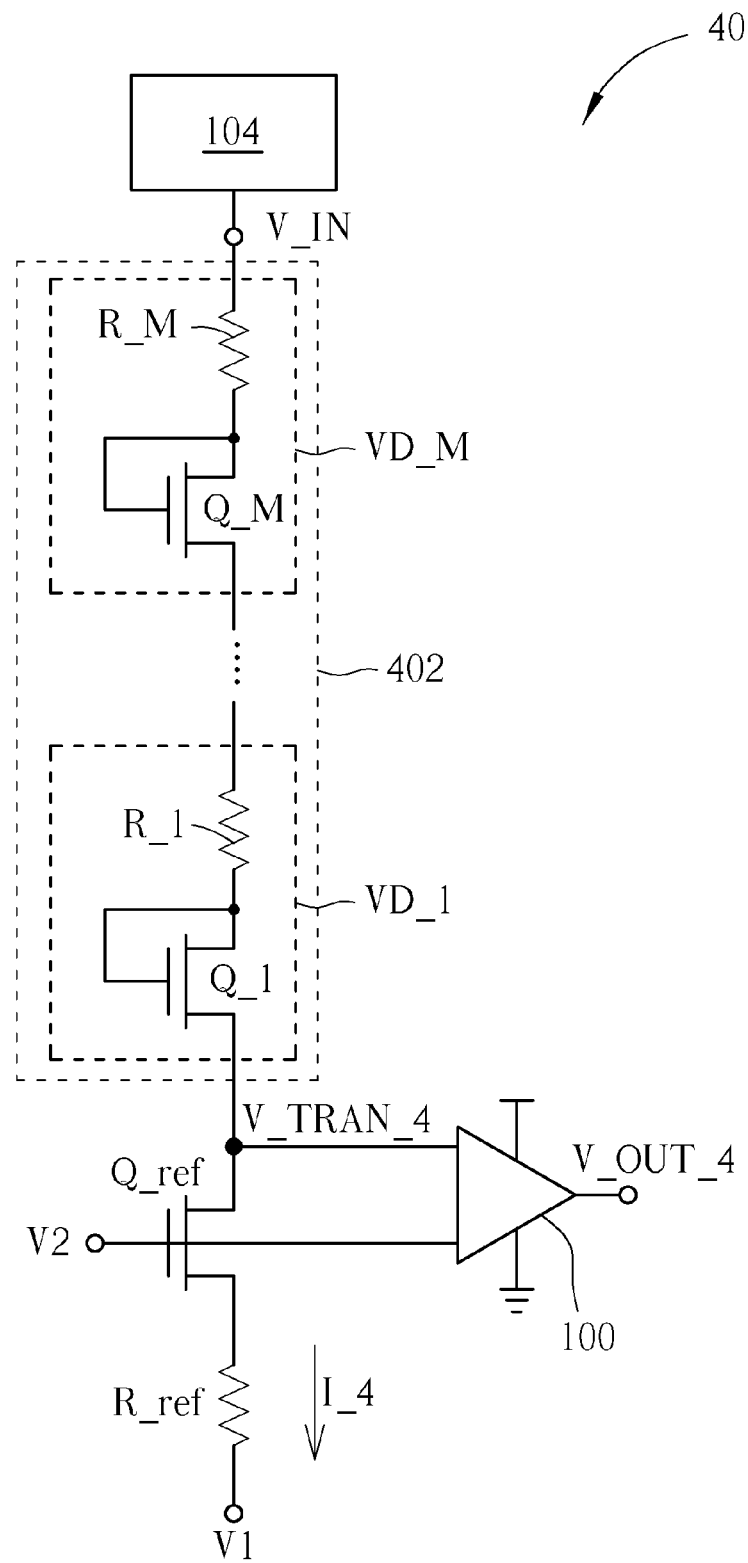
FIG. 4 is a schematic diagram of another voltage detection circuit according to an embodiment of the invention.

In addition, the requirements of the present invention are satisfied as long as the voltage dropping circuits VD_1-VD_M are properly designed to have each voltage dropping circuit VD_x generating substantially the same voltage drop. Those skilled in the art may make modification accordingly, and not limited therein. For example, in FIG. 1, a connecting method of the voltage drop circuit VD_x is that the first terminal of the voltage drop transistor Q_x is coupled to the second terminal of the voltage drop resistor R_x. Nevertheless, methods of connecting the voltage drop transistor Q_x and the voltage drop resistor R_x are not limited therein. Please refer to FIG. 4, which is a schematic diagram of a voltage detection circuit 40 according to an embodiment of the invention. As shown in FIG. 4, a connecting method of the voltage drop circuit VD_x is that the second terminal of the voltage drop transistor Q_x is coupled to the first terminal of the voltage drop resistor R_x. A voltage drop generated by the voltage drop circuit VD_x is a voltage difference between the second terminal of the voltage drop resistor R_x and the first terminal of the voltage drop transistor Q_x. Each voltage drop circuit VD_x generates the same voltage drop, which satisfies the requirements of the present invention. Similarly, the voltage detection circuit 40 may be properly modified as a multiple voltage detection circuit and a negative multiple voltage detection circuit. Detail modification methods are referred to related paragraph in the above, which are not narrated herein for brevity.

In summary, the present invention properly designs the voltage drop circuits such that each voltage drop circuit generates the same voltage drop value (e.g., the voltage drop transistors and the reference transistor are properly designed to be matched, and the voltage drop resistors and the reference resistor are properly designed to have substantially the same resistance), wherein the voltage drop value may be a reference voltage value, and an input terminal of the comparator receives the reference voltage or a ground voltage. The voltage detection circuit of the present invention may detect a specific multiple of the reference voltage precisely. Furthermore, the voltage detection circuit, the multiple voltage detection circuit, and the negative multiple voltage detection circuit utilize layout area efficiently and have characteristics as low quiescent current and low power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage detection circuit, for detecting an input voltage generated by an input voltage generator, the voltage detection circuit comprising:
   a reference resistor, comprising a first terminal and a second terminal, wherein the first terminal is utilized for receiving a first voltage;
   a reference transistor, comprising a first terminal, a second terminal and a control terminal, wherein the first terminal of the reference transistor is coupled to the second terminal of the reference resistor, and the control terminal of the reference transistor is utilized for receiving a second voltage;
   a comparator, comprising a first input terminal and a second input terminal, wherein the first input terminal is coupled to the second terminal of the reference transistor for receiving a converted voltage, the second input terminal is utilized for receiving the second voltage, and the comparator is utilized for generating an output voltage according to the converted voltage and the second voltage; and
   a voltage dropping circuit series, comprising a plurality of voltage dropping circuits connected in a sequence, wherein a terminal of the voltage dropping circuit series is coupled to the input voltage generator, another terminal of the voltage dropping circuit series is coupled between the first input terminal of the comparator and the second terminal of the reference transistor, and the plurality of voltage dropping circuits are utilized for generating a plurality of voltage drops to convert the input voltage into the converted voltage;

wherein the output voltage of the comparator indicates whether the input voltage matches a specific multiple of a voltage difference between the first voltage and the second voltage, and the specific multiple relates to a number of the plurality of voltage dropping circuits.

2. The voltage detection circuit of claim 1, wherein each voltage dropping circuit of the voltage dropping circuit series comprises:

a voltage drop transistor, comprising a first terminal, a second terminal and a control terminal, wherein the control terminal of the voltage drop transistor is coupled to the second terminal of the voltage drop transistor; and a voltage drop resistor, comprising a first terminal and a second terminal, wherein the second terminal of the voltage drop resistor is coupled to the first terminal of the voltage drop transistor;

wherein the second terminal of the voltage drop transistor and the first terminal of the voltage drop resistor generate a voltage drop of the plurality of voltage drops;

wherein the second terminal of the voltage drop transistor is further coupled to a first terminal of a voltage drop resistor of another voltage drop circuit, a first terminal of a voltage drop resistor of a voltage drop circuit at the beginning of the voltage dropping circuit series is coupled between the first input terminal of the comparator and the second terminal of the reference transistor, and a second terminal of a voltage drop transistor of a voltage drop circuit at the end of the voltage dropping circuit series is coupled to the input voltage generator.

3. The voltage detection circuit of claim 2, wherein the reference transistor and the voltage drop transistors are N-type metal oxide semiconductor (NMOS) transistors, the first terminal of the reference transistor is a source of the reference transistor, the second terminal of the reference transistor is a drain of the reference transistor, and the control terminal of the reference transistor is a gate of the reference transistor, the first terminal of each of the voltage drop transistors is a source of each of the voltage drop transistors, the second terminal of each of the voltage drop transistors is a drain of each of the voltage drop transistors, and the control terminal of each of the voltage drop transistors is a gate of each of the voltage drop transistors, the first voltage is a ground voltage, and the second voltage is a reference voltage.

4. The voltage detection circuit of claim 3, wherein when the input voltage rises to be greater than the specific multiple of the second voltage, the output voltage of the comparator changes a state, and the specific multiple is equal to the number of the plurality of voltage dropping circuits plus 1.

5. The voltage detection circuit of claim 3, wherein the output voltage is a power-on reset signal.

6. The voltage detection circuit of claim 2, wherein the reference transistor and the voltage drop transistors are P-type metal oxide semiconductor (PMOS) transistors, the first terminal of the reference transistor is a source of the reference transistor, the second terminal of the reference transistor is a drain of the reference transistor, and the control terminal of the reference transistor is a gate of the reference transistor, the first terminal of each of the voltage drop transistors is a source of each of the voltage drop transistors, the second terminal of each of the voltage drop transistors is a drain of each of the voltage drop transistors, and the control terminal of each of the voltage drop transistors is a gate of each of the voltage drop transistors, the first voltage is a reference voltage, and the second voltage is a ground voltage.

7. The voltage detection circuit of claim 6, wherein when the input voltage falls to be smaller than a specific negative voltage value of the specific multiple of the second voltage, the output voltage of the comparator changes a state, and the specific multiple is equal to the number of the plurality of voltage dropping circuits.

8. The voltage detection circuit of claim 6, wherein the output voltage is a negative voltage detection signal.

9. The voltage detection circuit of claim 1, wherein each voltage dropping circuit of the voltage dropping circuit series comprises:

a voltage drop transistor, comprising a first terminal, a second terminal and a control terminal, wherein the control terminal of the voltage drop transistor; and a voltage drop resistor, comprising a first terminal and a second terminal, wherein the first terminal of the voltage drop resistor is coupled to the second terminal of the voltage drop transistor;

wherein the first terminal of the voltage drop transistor and the second terminal of the voltage drop resistor generate a voltage drop of the plurality of voltage drops;

wherein the second terminal of the voltage drop resistor is further coupled to a first terminal of a voltage drop transistor of another voltage drop circuit, a first terminal of a voltage drop transistor of a voltage drop circuit at the beginning of the voltage dropping circuit series is coupled between the first input terminal of the comparator and the second terminal of the reference transistor, and a second terminal of a voltage drop resistor of a voltage drop circuit at the end of the voltage dropping circuit series is coupled to the input voltage generator.

10. The voltage detection circuit of claim 9, wherein the reference transistor and the voltage drop transistors are N-type metal oxide semiconductor (NMOS) transistors, the first terminal of the reference transistor is a source of the reference transistor, the second terminal of the reference transistor is a drain of the reference transistor, and the control terminal of the reference transistor is a gate of the reference transistor, the first terminal of each of the voltage drop transistors is a source of each of the voltage drop transistors, the second terminal of each of the voltage drop transistors is a drain of each of the voltage drop transistors, and the control terminal of each of the voltage drop transistors is a gate of each of the voltage drop transistors, the first voltage is a ground voltage, and the second voltage is a reference voltage.

11. The voltage detection circuit of claim 10, wherein when the input voltage rises to be greater than the specific multiple of the second voltage, the output voltage of the comparator changes a state, and the specific multiple is equal to the number of the plurality of voltage dropping circuits plus 1.

12. The voltage detection circuit of claim 10, wherein the output voltage is a power-on reset signal.

13. The voltage detection circuit of claim 9, wherein the reference transistor and the voltage drop transistors are P-type metal oxide semiconductor (PMOS) transistors, the first terminal of the reference transistor is a source of the reference transistor, the second terminal of the reference transistor is a drain of the reference transistor, and the control terminal of the reference transistor is a gate of the reference transistor, the first terminal of each of the voltage drop transistors is a source of each of the voltage drop transistors, the second terminal of each of the voltage drop transistors is a drain of each of the voltage drop transistors, and the control terminal of each of the voltage drop transistors is a gate of each of the voltage drop transistors, the first voltage is a reference voltage, and the second voltage is a ground voltage.

14. The voltage detection circuit of claim 13, wherein when the input voltage falls to be smaller than a specific negative voltage value of the specific multiple of the second voltage, the output voltage of the comparator changes a state, and the specific multiple is equal to the number of the plurality of voltage dropping circuits.

15. The voltage detection circuit of claim 13, wherein the output voltage is a negative voltage detection signal.

16. The voltage detection circuit of claim 1, wherein each voltage dropping circuit of the plurality of voltage dropping circuit generates substantially the same voltage drop.

* * * * *